United States Patent
Wada

(10) Patent No.: US 9,711,483 B2
(45) Date of Patent: Jul. 18, 2017

(54) BONDING APPARATUS

(71) Applicant: TORAY ENGINEERING CO., LTD., Chuo-ku, Tokyo (JP)

(72) Inventor: Hiromitsu Wada, Otsu (JP)

(73) Assignee: TORAY ENGINEERING CO., LTD., Tokyo (JP)

(*) Notice: Subject to any disclaimer, the term of this patent is extended or adjusted under 35 U.S.C. 154(b) by 0 days.

(21) Appl. No.: 15/028,819

(22) PCT Filed: Oct. 28, 2014

(86) PCT No.: PCT/JP2014/078542
§ 371 (c)(1),
(2) Date: Apr. 12, 2016

(87) PCT Pub. No.: WO2015/068607
PCT Pub. Date: May 14, 2015

(65) Prior Publication Data
US 2016/0284662 A1    Sep. 29, 2016

(30) Foreign Application Priority Data
Nov. 7, 2013 (JP) .................. 2013-231148

(51) Int. Cl.
*B23K 37/00* (2006.01)
*H01L 23/00* (2006.01)
(Continued)

(52) U.S. Cl.
CPC .......... *H01L 24/75* (2013.01); *B23K 1/0016* (2013.01); *B23K 1/06* (2013.01); *B23K 3/04* (2013.01);
(Continued)

(58) Field of Classification Search
CPC ......... H01L 24/75; H01L 24/83; H01L 24/95; H01L 2224/75301; H01L 2224/75824;
(Continued)

(56) References Cited

U.S. PATENT DOCUMENTS 4,200,393 A * 4/1980 Suzuki ................. H01L 21/681
228/9
4,606,492 A * 8/1986 Guslits ..................... B23K 3/00
228/179.1
(Continued)

FOREIGN PATENT DOCUMENTS

JP    2005-142537 A    6/2005
JP    2005-161783 A    6/2005
(Continued)

OTHER PUBLICATIONS

International Search Report of the corresponding International Application No. PCT/JP2014/078542, dated Feb. 3, 2015.

*Primary Examiner* — Kiley Stoner
(74) *Attorney, Agent, or Firm* — Global IP Counselors, LLP

(57) ABSTRACT

A bonding apparatus bonds a plurality of device chips on a plurality of electrode pads that are provided to a surface of a substrate. The bonding apparatus includes a stage, a head unit, a head lifting mechanism, a head vibrator, a heater, and a bonding region observation component. The substrate is placed and supported on the stage. The head unit holds the device chips. The head lifting mechanism raises and lowers the head unit in an up and down direction relative to the stage. The head vibrator vibrate the head unit in the up and down direction. The heater heats a bonding paste that bonds the device chips and the electrode pads. The bonding region observation component observes a region that includes at least a peripheral part of the electrode pads.

19 Claims, 8 Drawing Sheets

(51) Int. Cl.
  *B23K 37/04* (2006.01)
  *H05K 3/00* (2006.01)
  *B23K 1/00* (2006.01)
  *B23K 1/06* (2006.01)
  *B23K 3/04* (2006.01)
  *B23K 3/06* (2006.01)
  *B23K 3/08* (2006.01)
  *H05K 3/34* (2006.01)

(52) U.S. Cl.
  CPC .............. *B23K 3/0638* (2013.01); *B23K 3/08* (2013.01); *B23K 37/04* (2013.01); *H01L 24/83* (2013.01); *H01L 24/95* (2013.01); *H05K 3/0008* (2013.01); *H01L 24/27* (2013.01); *H01L 24/29* (2013.01); *H01L 24/32* (2013.01); *H01L 2224/2732* (2013.01); *H01L 2224/29298* (2013.01); *H01L 2224/29339* (2013.01); *H01L 2224/32225* (2013.01); *H01L 2224/753* (2013.01); *H01L 2224/7598* (2013.01); *H01L 2224/75301* (2013.01); *H01L 2224/75745* (2013.01); *H01L 2224/75824* (2013.01); *H01L 2224/75901* (2013.01); *H01L 2224/8384* (2013.01); *H01L 2224/83192* (2013.01); *H01L 2224/83908* (2013.01); *H05K 3/3436* (2013.01); *H05K 2203/163* (2013.01); *H05K 2203/166* (2013.01)

(58) Field of Classification Search
  CPC ... H01L 2224/2732; H01L 2224/29298; H01L 2224/29339; H01L 24/27; H01L 2224/753; H01L 2224/75745; H01L 2224/75901; H01L 2224/83192; H01L 2224/8384; H01L 2224/83908; H01L 2224/7598; H01L 24/29; H01L 24/32; H01L 2224/32225; B23K 1/06; B23K 3/04; B23K 1/0016; B23K 3/08; B23K 3/0638; B23K 37/04–37/0461; B23K 35/025; B23K 2201/36–2201/42; H05K 3/0008; H05K 2203/166; H05K 2203/163; H05K 3/3436
  USPC .... 228/4.1, 6.2, 102–103, 105, 248.1–248.5, 228/8–12, 49.5, 44.7, 179.1–180.22
  See application file for complete search history.

(56) References Cited

U.S. PATENT DOCUMENTS

| | | | | |
|---|---|---|---|---|
| 5,190,205 A * | 3/1993 | Ozawa | B23K 20/021 | 228/44.7 |
| 5,351,872 A * | 10/1994 | Kobayashi | B23K 20/02 | 228/102 |
| 5,420,691 A * | 5/1995 | Kawaguchi | H05K 13/0439 | 29/721 |
| 5,555,316 A * | 9/1996 | Tsujikawa | G06T 7/0006 | 348/126 |
| 5,564,183 A * | 10/1996 | Satou | B23K 31/12 | 29/593 |
| 5,667,129 A * | 9/1997 | Morita | H05K 13/0413 | 228/102 |
| 5,699,951 A * | 12/1997 | Miyoshi | B23K 20/004 | 228/4.5 |
| 5,982,927 A * | 11/1999 | Koljonen | B23K 3/0638 | 382/145 |
| 6,237,490 B1 * | 5/2001 | Takahashi | B41F 15/0818 | 101/123 |
| 8,961,709 B1 * | 2/2015 | Takaura | B23K 35/0244 | 148/24 |
| 2004/0031406 A1 * | 2/2004 | Otake | B41F 33/0036 | 101/129 |
| 2004/0213450 A1 * | 10/2004 | Okada | B23K 1/0016 | 382/145 |
| 2005/0077340 A1 * | 4/2005 | Nagafuku | H05K 13/08 | 228/8 |
| 2005/0098610 A1 * | 5/2005 | Onobori | B23K 1/0016 | 228/180.21 |
| 2006/0144264 A1 * | 7/2006 | Sakaida | H05K 3/1216 | 101/123 |
| 2008/0257937 A1 * | 10/2008 | Kihara | B23K 1/0016 | 228/9 |
| 2008/0289175 A1 * | 11/2008 | Inoue | H05K 3/303 | 29/840 |
| 2008/0289518 A1 * | 11/2008 | Inoue | B41F 15/0818 | 101/123 |
| 2009/0064489 A1 * | 3/2009 | Inoue | H05K 3/3484 | 29/739 |
| 2010/0163602 A1 * | 7/2010 | Okamoto | B23K 3/0623 | 228/102 |
| 2010/0230472 A1 * | 9/2010 | Okamoto | H05K 3/3436 | 228/104 |
| 2011/0249096 A1 * | 10/2011 | Umemura | G01B 11/0608 | 348/46 |
| 2012/0012645 A1 * | 1/2012 | Motomura | H05K 3/363 | 228/179.1 |
| 2012/0014084 A1 * | 1/2012 | Motomura | B23K 3/0638 | 361/807 |
| 2013/0044204 A1 * | 2/2013 | Ishigaki | G01N 21/95684 | 348/86 |
| 2013/0181040 A1 * | 7/2013 | Watanabe | H01L 21/4814 | 228/211 |
| 2014/0102322 A1 * | 4/2014 | Tomomatsu | B41F 15/08 | 101/123 |
| 2014/0157591 A1 * | 6/2014 | Nagai | H05K 13/08 | 29/739 |
| 2015/0129641 A1 * | 5/2015 | Kuroda | B23K 3/0638 | 228/41 |
| 2015/0136837 A1 * | 5/2015 | Maeda | H05K 13/08 | 228/102 |
| 2015/0216058 A1 * | 7/2015 | Mantani | B41F 15/12 | 427/282 |
| 2015/0345930 A1 * | 12/2015 | Ikeda | G01B 11/0616 | 356/630 |
| 2016/0158939 A1 * | 6/2016 | Nakada | B25J 9/1682 | 156/60 |

FOREIGN PATENT DOCUMENTS

| | | | | |
|---|---|---|---|---|
| JP | 2006017474 A | * | 1/2006 | ......... H05K 3/3484 |
| JP | 2006-059904 A | | 3/2006 | |
| JP | 2013-041870 A | | 2/2013 | |
| WO | 2006-118018 A1 | | 11/2006 | |

* cited by examiner

BONDING APPARATUS

CROSS-REFERENCE TO RELATED APPLICATIONS

This application is a U.S. National stage of International Application No. PCT/JP2014/078542 filed on Oct. 28, 2014. This application claims priority to Japanese Patent Application No. 2013-231148 filed with Japan Patent Office on Nov. 7, 2013. The entire disclosure of Japanese Patent Application No. 2013-231148 is hereby incorporated herein by reference.

BACKGROUND

Field of the Invention

The present invention relates to a bonding apparatus for bonding device chips onto a substrate coated with a bonding paste over electrode pads.

Background Information

Substrate modules in which parts (known as device chips) containing resistors, capacitors, reactance elements, switching circuits, or the like are bonded on a wiring board have been used in the past in a variety of applications.

As hybrid automobiles and electric automobiles have gained in popularity in recent years, substrate modules in which device chips called power devices or power transistors have been bonded have also become popular, and various studies have been conducted into bonding methods (see Japanese Laid-Open Patent Application Publication No. 2006-59904 (Patent Literature 1) and Japanese Laid-Open Patent Application Publication No. 2013-41870 (Patent Literature 2)).

A technique has also been examined in which a suitable amount of a conductive paste for the die-bonding of semiconductor chips is applied to a lead frame or other such semiconductor mounting component (see Japanese Laid-Open Patent Application Publication No. H8-306715 (Patent Literature 3)).

SUMMARY

When a plurality of device chips are bonded on a substrate constituting a substrate module, bonding the device chips all at once is preferable to bonding them one by one in terms of improving productivity. Conductive pastes used for bonding (hereinafter referred to as bonding pastes) that are applied to bond electrode pads and device chips are only applied in the smallest amount required, while still affording good bonding, in order to prevent short-circuiting between adjacent electrodes or device chips.

When a plurality of device chips are bonded on a substrate constituting such a substrate module, the optimal states for the applied amount of bonding paste, the temperature profile at which these device chips and the substrate are heated, and the pressurization and vibration conditions for these device chips (hereinafter referred to as optimal bonding conditions), as well as the permissible ranges around these values (known as process margins) must be found in advance, and these condition ranges maintained during the bonding.

However, the work entailed by finding these optimal bonding conditions and process margins (setting the conditions) takes time and effort because it involves finding by trial and error the bonding conditions at which bonding failure will not occur, while confirming the bonding strength of the various device chips. The work entailed by setting the conditions and confirming the strength also had to be performed every time a new manufacturing product was introduced. Also, sampling and inspection during production, and strength checking after a model changeover had to be performed as needed. The term "bonding failure" used here refers to when the contact surface area between the device chips and the bonding paste is not what it is supposed to be, or a state in which there is a short-circuit between adjacent device chips or electrode pads because of excessive bulging out of the bonding paste during bonding.

In view of this, it is an object of the present application to provide a bonding apparatus with which bonding failures between device chips and electrode pads can be prevented in the simultaneous bonding of a plurality of device chips, and the optimal bonding conditions can be found quickly.

To solve the above problem, the first aspect is:

a bonding apparatus for bonding a plurality of device chips on a plurality of electrode pads provided to a substrate surface, the bonding apparatus comprising:

a stage on which the substrate is placed and supported;

a head unit with which a plurality of device chips that are bonded on the plurality of electrode pads are supported all at once;

a head lifting mechanism for raising and lowering the head unit in the up and down direction relative to the stage;

a head vibrator for vibrating the head unit in the up and down direction;

a heater for heating a bonding paste that bonds the device chips and the plurality of electrode pads; and a bonding region observation component for observing a region that includes at least the area around the electrode pads to which the plurality of device chips have been bonded, wherein, of the support member of the stage that supports the substrate, the area around the electrode pads to which the plurality of device chips have been bonded, and the portion corresponding to the outside thereof, are made from a transparent material, the bonding region observation component is disposed opposite the head unit so as to sandwich the support member of the stage, and the bonding region observation component comprises:

an image signal acquisition component that acquires as an image signal the image observed with the bonding region observation component; and a paste state tester that tests the state of the bonding paste that touches the plurality of device chips, based on the image signal.

The second aspect is the bonding apparatus according to the first aspect, wherein the paste state tester tests the bulge distance of the bonding paste bulging out from the periphery of the plurality of device chips.

The third aspect is the bonding apparatus according to the second aspect, comprising a permissible bulge range setting component for setting a permissible bulge range for the bulge distance of the bonding paste bulging out from the outer peripheral part of the plurality of electrode pads, wherein the paste state tester tests whether or not the bulge distance of the bonding paste bulging out from the outer peripheral part of the plurality of electrode pads is within the permissible bulge range.

The fourth aspect is the bonding apparatus according to the third aspect, wherein the paste state tester notifies the user that the bulge distance of the tested bonding paste is abnormal if the bulge distance of the tested bonding paste is outside the permissible bulge range for at least one of the plurality of electrode pads.

The fifth aspect is the bonding apparatus according to any one of the second to fourth aspects, comprising:

a permissible bulge upper limit setting component for setting a permissible bulge upper limit for the bulge distance of the bonding paste bulging out from the outer peripheral part of the plurality of electrode pads; and a controller that halts the heating by the heater or raises the head unit if the paste state tester determines that the bonding paste bulging out from the outer peripheral part of the plurality of electrode pads has reached the permissible bulge upper limit.

The sixth aspect is the bonding apparatus according to any one of the second to fifth aspects, comprising:

a head pressurization component for further pressurizing the head unit toward the stage side;

a permissible bulge upper limit setting component for setting a permissible bulge upper limit for the bulge distance of the bonding paste bulging out from the outer peripheral part of the plurality of electrode pads; and a controller that halts the pressurization by the head pressurization component if the paste state tester determines that the bonding paste bulging out from the outer peripheral part of the plurality of electrode pads has reached the permissible bulge upper limit.

The seventh aspect is the bonding apparatus according to the first aspect, wherein the paste state tester tests the curing reaction state of the bonding paste.

The eighth aspect is the bonding apparatus according to the seventh aspect, comprising a curing reaction state permissible range setting component for setting the permissible range of the curing reaction state of the bonding paste, wherein the paste state tester tests whether or not the bonding paste is within the permissible range of the curing reaction state.

The ninth aspect is the bonding apparatus according to the eighth aspect, wherein the paste state tester notifies the user that the curing reaction state of the tested bonding paste is abnormal if the tested bonding paste is outside the permissible range of the curing reaction state for at least one of the plurality of electrode pads.

The tenth aspect is the bonding apparatus according to any one of the seventh to ninth aspects, comprising:

a permissible curing reaction state upper limit setting component for setting the permissible upper limit for the curing reaction state of the bonding paste; and a controller that halts the heating by the heater or raises the head unit if the paste state tester determines that the bonding paste has reached the permissible upper limit for the curing reaction state.

The eleventh aspect is the bonding apparatus according to any one of the seventh to tenth aspects, further comprising:

a head pressurization component for further pressurizing the head unit toward the stage side;

a permissible curing reaction state upper limit setting component for setting a permissible upper limit for the curing reaction state of the bonding paste; and a controller that halts the pressurization by the head pressurization component if the paste state tester determines that the bonding paste has reached the permissible upper limit for the curing reaction state.

In the simultaneous bonding of a plurality of device chips, bonding failure between the device chips and electrode pads can be prevented, and the optimal bonding conditions can be found quickly.

DETAILED DESCRIPTION OF EMBODIMENTS

Figure 1:
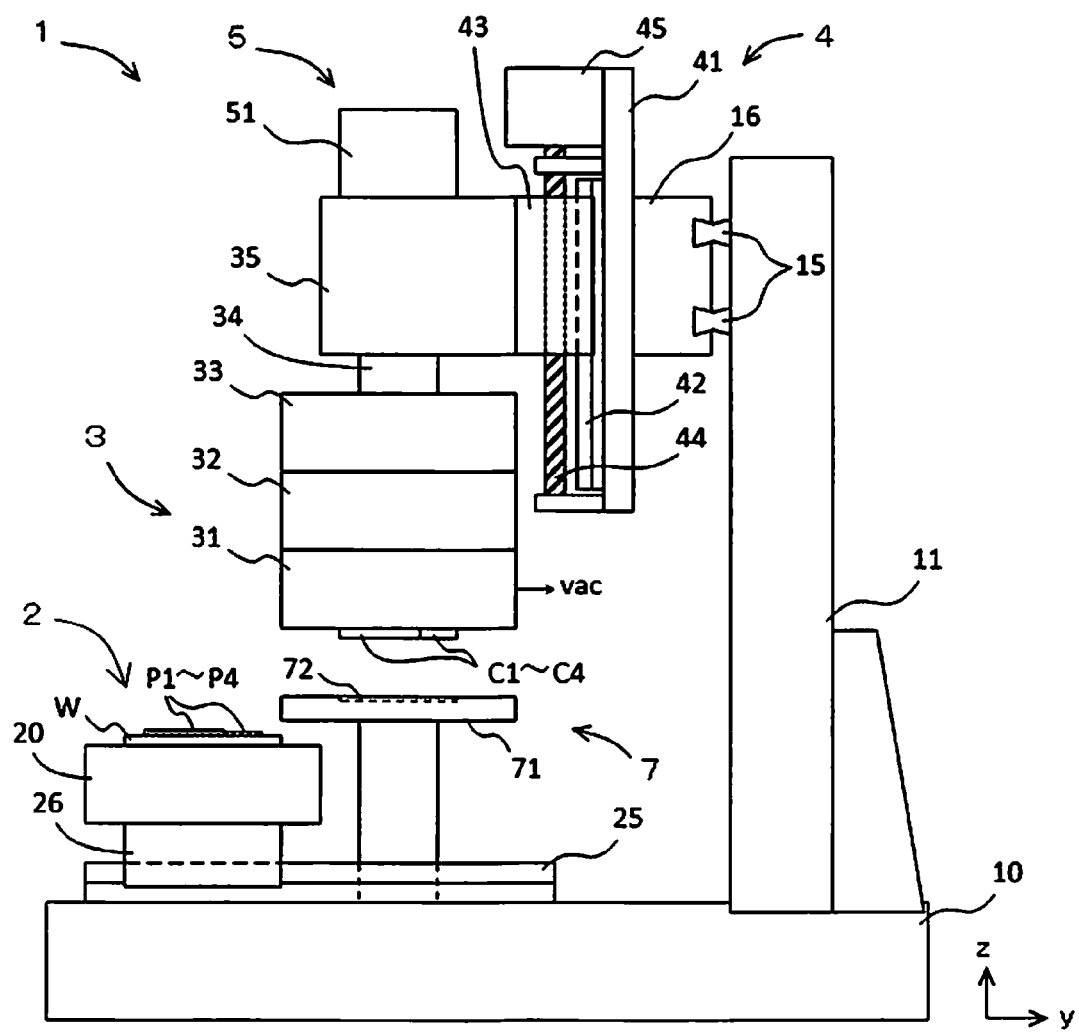
FIG. 1 is an overall side view of an example of a specific embodiment of the present invention.

An embodiment of the present invention will now be described through reference to the drawings. To simplify the description, an example will be given in which four electrode pads P1 to P4 are formed on the surface of a substrate W (the bonding object), and device chips C1 to C4 are bonded over these.

In the drawings, the three axes of a rectangular coordinate system are labeled X, Y, and Z, the XY plane is the horizontal plane, and the Z direction is the vertical direction. In particular, the X direction is shown such that the arrow direction represents the side closer to the viewer and the opposite direction the side farther away from the viewer. For the Y direction, the arrow direction is to the right side, and the opposite direction to the left side. For the Z direction, the arrow direction (gravitationally upward) is the upper side, and the opposite direction the lower side.

FIG. 1 is a simplified overall diagram of a specific embodiment of the present invention.

The bonding apparatus 1 pertaining to the present invention comprises a stage 2, a head unit 3, head lifting mechanism 4, a head vibrator 5, a chip supplier 7, a bonding region observation component 8, and a heater.

The substrate W, on which the device chips are to be bonded, is placed horizontally on the stage 2. The stage 2 is equipped with a substrate placement pad 20, at which no substrate holding force is exerted during placement or replacement of the substrate W, and a substrate holding force is exerted after the substrate has been placed.

If the stage 2 does not need to move, it may be attached to an apparatus frame 10.

On the other hand, if the stage 2 needs to move in the Y direction, as shown in FIG. 1, the configuration preferably allows movement in the Y direction. In this case, a pair of rails 25 extending in the Y direction are disposed on the apparatus frame 10, and a Y axis slider 26 that moves over the rails 25 in the Y direction is provided. A Y axis slider drive mechanism (not shown) is also provided to move the Y axis slider 26 at a specific speed in a specific direction and stop it at a specific place, based on a control signal from the outside.

More specifically, an example of the Y axis slider drive mechanism is one in which the Y axis slider 26 is driven by a rotational motor or a ball screw, or is driven by a linear motor, or is driven by an air cylinder or a hydraulic cylinder. As a result, the place on the stage 2 where the substrate W is placed or where the next substrate is replaced can be set independently from the place where the device chips are bonded.

The chip supplier 7 supplies a plurality of device chips C1 to C4 that are bonded over the electrode pads P1 to P4 in a state of corresponding to the position and spacing of the electrode pads P1 to P4 on the substrate W. More specifically, the chip supplier 7 comprises a chip supply pad 71 on which the device chips C1 to C4 are placed. To give a more specific example of this, the chip supply pad 71 has recesses 72 corresponding to the external shape of the device chips C1 to C4, and the depth of these recesses 72 is set to be shallower than the thickness of the device chips C1 to C4. The position and spacing of the recesses 72 match the position and spacing of the electrode pads P1 to P4 of the substrate W. Therefore, the device chips C1 to C4 fall into the recesses 72 of the chip supply pad 71 and are arranged in a state in which the surfaces of the chips are higher than the surface of the chip supply pad 71. The chip supplier 7 is disposed at a position where it will not physically interfere with the stage 2. For example, FIG. 1 shows how the stage 2 is disposed near the front, and the chip supplier 7 is disposed further to the rear (the same applies to FIG. 3; discussed below).

The chip supplier 7 is not limited to the chip supply pad 71 having recesses, and other options are also possible. For instance, reference pins, reference bars, or other such chip positioning members may be disposed to follow the contour of the device chips C1 to C4. These chip positioning members are disposed to conform to the device chips C1 to C4, and therefore correspond to the position and spacing of the electrode pads P1 to P4 on the substrate W.

Alternatively, the chip supplier 7 may comprise a flat chip supply pad and a chip mounter that arranges the device chips C1 to C4 at specific positions and spacing. That is, the electrode pads P1 to P4 are arranged on the flat chip supply pad in a state of corresponding to the position and spacing of the electrode pads P1 to P4 on the substrate W.

Because the chip supplier 7 is configured in this way, the device chips C1 to C4 can be disposed ahead of time in a state of corresponding to the position and spacing of the electrode pads P1 to P4 on the substrate W. Therefore, these chips can be picked up all at once by the head unit 3, and can be bonded while maintaining a specific position and spacing on the electrode pads P1 to P4 of the substrate W.

This chip supplier 7 may be provided to the bonding apparatus 1 pertaining to the present invention, but it is not an essential constituent element. For example, instead of the chip supplier 7, a chip conveyance mechanism (a so-called chip slider) may be used, which is incorporated into a chip transfer and conveyance apparatus disposed adjacent to the bonding apparatus 1. In this case, the chip slider operation is linked to that of the head unit 3, allowing the device chips to be supplied and picked up.

The head unit 3 is used to support the device chips C1 to C4, which are bonded over the substrate W, all at once. The head unit 3 is made up of a chip holder 31 and a heater 32.

The chip holder 31 is used to support the device chips C1 to C4. The chip holder 31 exerts a holding force until the device chips C1 to C4 are picked up and bonded to the substrate W, and does not exert from before the head is lifted (after bonding) until the next device chip is picked up.

More specifically, the chip holder 31 has grooves or holes provided in its surface, at a portion more to the inside than the contours of the device chips C1 to C4 being picked up. These grooves or holes are connected to an external vacuum generating mechanism (not shown) via a switching valve (not shown), and can be switched between a vacuum state and an atmospheric pressure state. This allows the chip holder 31 to hold the device chips C1 to C4 by suction and then release this hold as needed.

The above-mentioned substrate placement pad 20 of the stage 2, the chip supply pad 71 of the chip supplier 7, and the chip holder 31 of the head unit 3 are pre-adjusted to be parallel to each other.

The heater 32 is used to heat a bonding paste CP that bonds the electrode pads P1 to P4 to the respective device chips C1 to C4.

More specifically, the heater 32 can include a ceramic heater, a sheath heater, or the like, and heating can be switched on and off and the heating temperature set by voltage control or external voltage. Because of this configuration, the heater 32 provided to the head unit 3 is able to heat the bonding paste CP via the device chips C1 to C4.

Figure 2:
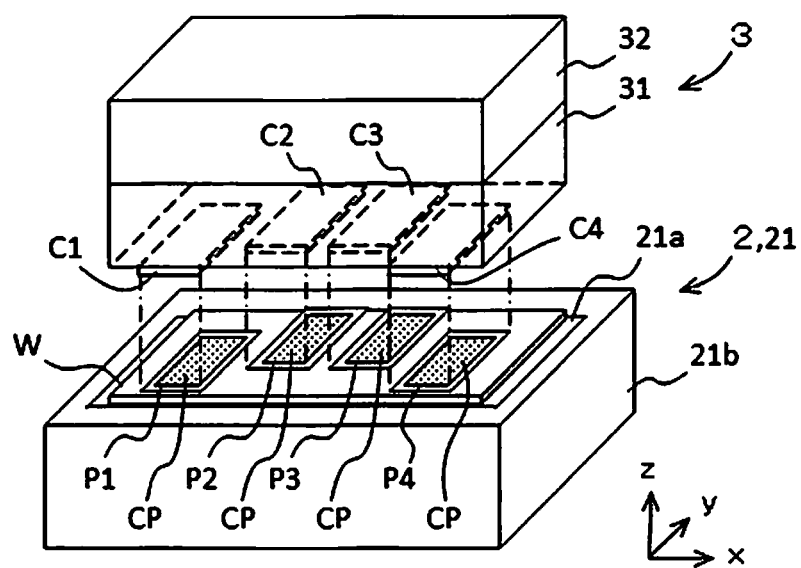
FIG. 2 is an oblique view of the main components in a specific embodiment of the present invention.

FIG. 2 is a simplified view of the main components in a specific embodiment of the present invention.

FIG. 2 shows the substrate placement pad 20 of the stage 2, the chip holder 31 and heater 32 of the head unit 3, and the device chips C1 to C4 held on the lower face of the chip holder 31. The substrate W, which is the object of bonding by the bonding apparatus 1 pertaining to the present invention, is placed on the substrate placement pad 20.

The electrode pads P1 to P4 formed on the surface of the substrate W, which is the object of bonding by the bonding apparatus 1 pertaining to the present invention, are coated ahead of time with a suitable amount of the bonding paste CP. Taking the pressure during bonding into account, this bonding paste CP is applied in a specific thickness (that is, the necessary amount) by screen printing, for example, more to the inside than the contour of the electrode pads P1 to P4.

The head lifting mechanism 4 is used to raise and lower the head unit 3 in the up and down direction relative to the stage 2 and the chip supplier 7. The head unit 3 is attached to a Z axis slider 43, which is a movable-side member of the head lifting mechanism 4.

Figure 3:
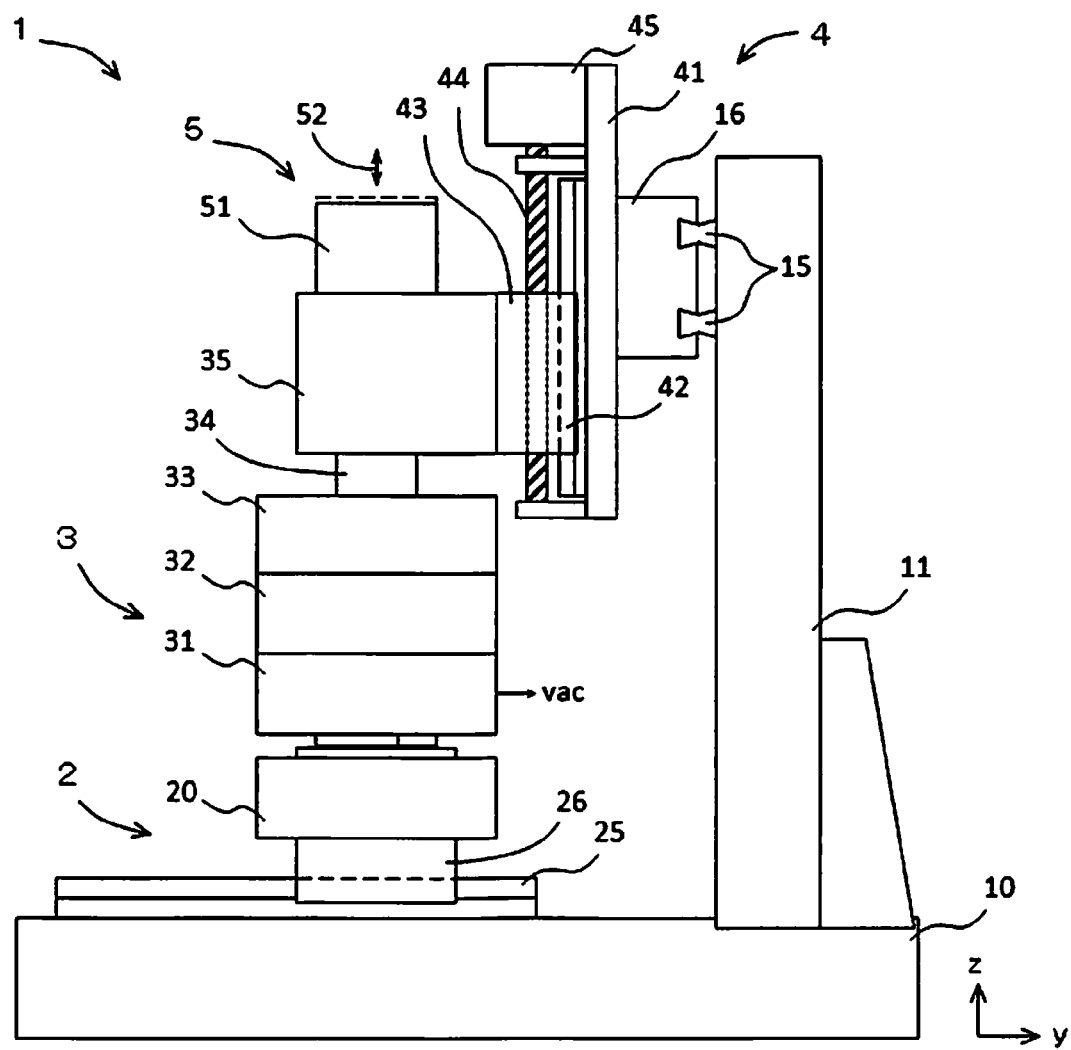
FIG. 3 is an overall side view of an example of a specific embodiment of the present invention.

FIG. 3 is a simplified overall view of an example of a specific embodiment of the present invention.

FIG. 1 shows a state in which the head unit 3 and the Z axis slider 43 of the head lifting mechanism 4 have been raised, while FIG. 3 shows a state in which the head unit 3 and the Z axis slider 43 have been lowered.

More specifically, the head lifting mechanism 4 comprises a base plate 41, a pair of rails 42 extending in the Z direction and disposed on the base plate 41, and the Z axis slider 43 that moves over the rails 42 in the Z direction. A rotational motor 45 is attached via a ball screw 44 to the Z axis slider 43. The rotational motor 45 rotates at a specific speed in a specific direction based on an external control signal, and can stop at a specific angle. Therefore, it can move the Z axis slider 43 at a specific speed in a specific direction based on an external control signal, and can stop it at a specific place. Even more specifically, a braking mechanism (not shown) may be provided to mechanically brake the rotation of the rotational motor 45. Also, the head unit 3 is suitably attached to the Z axis slider 43 via linking members 33, 34, and 35. Therefore, the head unit 3 can be raised and lowered in the up and down direction and stopped at a specific position based on an external control signal.

The head lifting mechanism 4 is not limited to the use of a rotational motor as discussed above, and may be configured such that an air cylinder or hydraulic cylinder is used to raise and lower the Z axis slider 43 in the up and down direction.

If the head lifting mechanism 4 does not need to move the head unit 3 horizontally, it may be attached in a fixed state to the apparatus frame 10 via the base plate 41 or a linking member 11. In this case, the above-mentioned chip supplier 7 may be equipped with a mechanism for maintaining a state of no physical interference with the stage 2 while moving the chip supply pad 71 to under the head unit 3 and standing by in that state.

On the other hand, if the head lifting mechanism 4 does need to move the unit in the X direction, it is preferably configured to be movable in the X direction as shown in FIGS. 1 and 3. In this case, a pair of rails 15 extending in the X direction are disposed on the linking member 11, an X axis slider 16 that moves in the X direction over the rails 15 is provided, and the base plate 41 is attached to the X axis slider 16. An X axis slider drive mechanism (not shown) is then provided to move the X axis slider 16 at a specific speed and stop it at a specific place, based on an external control signal.

More specifically, an example of the X axis slider drive mechanism is one in which the X axis slider 16 is driven by a rotational motor or a ball screw, or is driven by a linear motor, or is driven by an air cylinder or a hydraulic cylinder. As a result, the place on the head unit 3 where the device chips C1 to C4 are picked up can be set independently from the place where the device chips C1 to C4 are bonded to the substrate W.

The head vibrator 5 is used to vibrate the head unit 3 in the up and down direction. More specifically, an example of the head vibrator 5 is a high-frequency vibration generator 51, which is attached to a linking member 35 to which the head unit 3 is attached via the linking members 33 and 34. The high-frequency vibration generator 51 suitably vibrates at a specific amplitude and frequency based on an external control signal. Even more specifically, the high-frequency vibration generator 51 has an internal rotational motor, for example, and an eccentric weight attached to this rotational motor is rotated to generate vibration in the direction indicated by the arrow 52. Alternatively, the high-frequency vibration generator 51 may generate vibration in the direction indicated by the arrow 52 by having a vibrator with a specific weight move back and forth.

The bonding paste CP used in the bonding of the device chips has a high viscosity, which makes it difficult to spread out evenly with mere pressure. That is, in the center and peripheral parts of the region coated with the bonding paste CP, it is difficult to spread out the paste in a thin layer while maintaining a uniform thickness. Accordingly, after the unbonded device chips C1 to C4 are brought into contact with the bonding paste CP applied to the electrode pads P1 to P4, vibration is applied, which spreads out the bonding paste CP in a more even, thin layer while allowing the device chips C1 to C4 and the electrode pads P1 to P4 to be closer together than when no vibration is applied. Therefore, the bonding apparatus 1 pertaining to the present invention can be considered a particularly preferable mode for bonding a plurality of device chips to a substrate W coated with a high-viscosity bonding paste CP.

Figure 4:
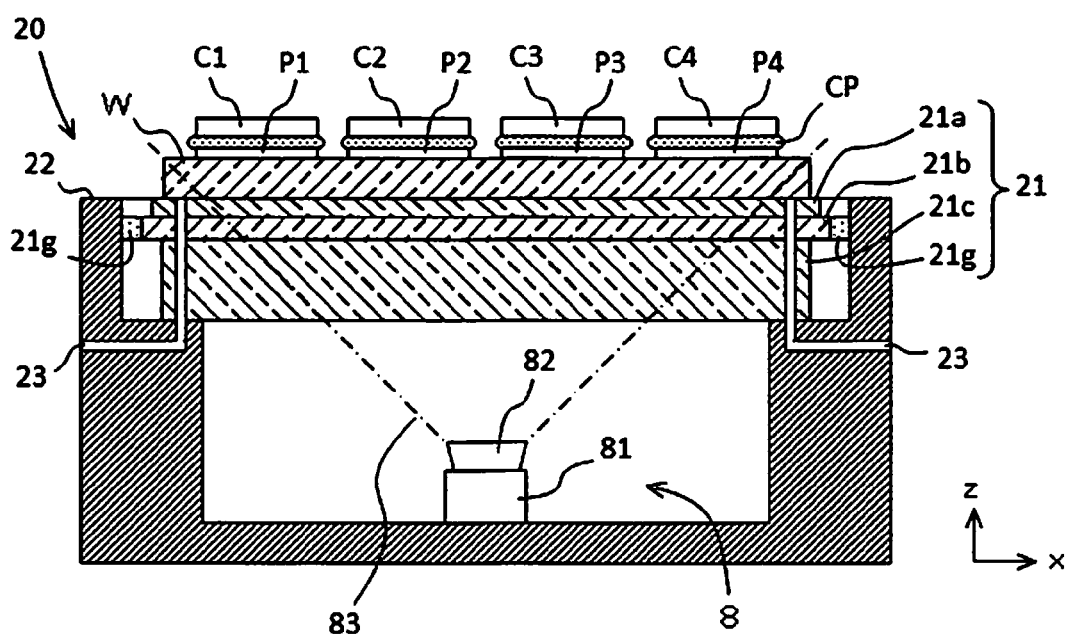
FIG. 4 is a cross section of the main components in a specific embodiment of the present invention.

FIG. 4 is a cross section of the main components in a specific embodiment of the present invention, and shows the substrate placement pad 20 of the stage 2, and a bonding region observation component 8 built into the interior thereof.

With the substrate placement pad 20, of a support member that supports the substrate W, at least the outer peripheral part of the bonded device chips, and the portion corresponding to the outside thereof, are made of a transparent material.

More specifically, the substrate placement pad 20 includes a support member 21, a frame member 22, and suction components 23. The support member 21 is used to directly support the substrate W by touching the substrate W. The support member 21 includes a protective plate 21a, a heater 21b, a reinforcing plate 21c, and a heat shield 21g.

The protective plate 21a directly touches the substrate W, and transmits thermal energy generated by the heater 21b to the substrate W. It also electrically insulates the heater 21b from the substrate W. The heater 21b is used to heat the substrate W. The reinforcing plate 21c ensures the strength of the support member 21, while also preventing thermal energy generated by the heater 21b from escaping to the frame member 22. The heat shield 21g is used to prevent thermal energy generated by the heater 21b from escaping to the frame member 22.

More specifically, the protective plate 21a and the reinforcing plate 21c are made of glass sheets. The heater 21b is made of a glass sheet and transparent electrodes of ITO, IZO, or the like formed on the surface thereof. The heater 21b applies current and voltage to these transparent electrodes and generates heat through internal resistance of the transparent electrodes. An external power supply (not shown) applies voltage or voltage control to these transparent electrodes, allowing the heating to be switched on and off and the heating temperature to be set.

The heat shield 21g is made from a material that combines heat resistance with heat blocking properties, such as silica or alumina, and is disposed in a specific width and thickness, between the frame member 22 and the outer edge of the heater 21b. Therefore, the outer edge of the heater 21b does not directly touch the frame member 22.

Because of this configuration, the heater 21b can heat the bonding paste CP via the protective plate 21a, the substrate W, and the electrode pads P1 to P4. If they do not have a built-in heater, the support member 21 may be constituted by a single layer of glass.

The frame member 22 is used to support the support member 21.

The frame member 22 is constituted by a box or a picture frame-like housing having an opening on the upper face.

It is used to support the entire support member 21 on which the substrate W is placed, from the lower face side, when the head unit 3 lowers and presses the device chips C1 to C4 against the substrate W.

The suction components 23 are communicating ports for applying suction to the substrate W.

More specifically, the suction components 23 communicate with the exterior by passing through the support member 21 or the frame member 22 to a portion further to the interior than the outer peripheral part of the substrate W. Even more specifically, the suction components 23 are connected via switching valves (not shown) or the like to an external vacuum generation mechanism (not shown), and can be switched between a vacuum state and an atmospheric pressure state. The structure may also be such that grooves or the like are provided to the protective plate 21a in a specific pattern, allowing the suction of the substrate W to be efficiently switched on and off.

The material used for the above-mentioned support member 21 is not limited to a sheet of glass, and may be any material that will transmit the wavelength of the observation light of the bonding region observation component 8. That is, if the observation light is visible light rays, a transparent material in the strict sense can be selected, such as an acrylic resin, PET resin, or polycarbonate resin. On the other hand, if the observation light is infrared rays or the like, a transparent material in the broad sense can be selected, such as a ceramic material that transmits infrared rays.

The bonding region observation component 8 is used to observe the region including at least the area around the device chips C1 to C4 bonded on the electrode pads P1 to P4. If the electrode pads P1 to P4 are transparent, the bonding region observation component 8 observes so as to include the region more to the inside than the outer edges of the bonding paste CP, and if the electrode pads P1 to P4 are made of a metal or other non-transparent material, the bonding region observation component 8 observes so as to include at least the region outside of the periphery of the electrode pads P1 to P4 and more to the inside than the outer edges of the bonding paste CP bulging out from the periphery to the outside.

More specifically, the bonding region observation component 8 is a combination of an area sensor camera 81 in which a CCD or a CMOS is used as an imaging element, and an imaging lens 82, and is set to an angle of field that allows the electrode pads P1 to P4, the area around them, and the region on the outside thereof to be observed all at once.

Furthermore, the bonding region observation component 8 is disposed opposite the head unit 3 so as to sandwich the support member 21 of the stage 2. That is, the area sensor camera 81 is disposed so that the focal point is on the electrode pads P1 to P4 of the substrate W disposed on the support member 21, the bonding paste CP applied over these pads, and the area surrounding the device chips C1 to C4 that are bonded over this. The area sensor camera 81 can observe the region on the inside of the field angle represented by the dashed line 83.

The area sensor camera 81 also subjects the captured image to signal processing, and outputs the resulting image signal to the outside. The "image signal" referred to here means an analog video signal in NTSC, PAL, or other format, or a digitally encoded video signal.

A paste state tester 9 is used to test the state of the bonding paste CP touching the device chips C1 to C4, based on an image signal corresponding to the image observed by the bonding region observation component 8. The "state of the bonding paste CP" referred to here is the bulging state or the curing reaction state of the bonding paste CP. That is, the tester tests the bulging state, which is whether or not the bonding paste CP has bulged out to the surrounding area of the device chips C1 to C4 when the device chips C1 to C4 are bonded to the electrode pads P1 to P4 under heating and pressure, whether or not it is bulging out from the electrode pads P1 to P4, and how far the bonding paste CP is bulging out from these. Alternatively, the curing reaction state of the paste is tested to see how much the color of the bonding paste CP has changed and whether or not the specified bonding strength can be exhibited.

More specifically, the paste state tester 9 can include an image processing apparatus 91 and an image processing program that is installed therein.

The image processing apparatus 91 comprises an image signal acquisition component 93. The image signal acquisition component 93 is used to acquire image signals outputted from the bonding region observation component 8. The image processing apparatus 91 performs restoration processing on the image signal acquired by the image signal acquisition component 93, and restores the image observed by the bonding region observation component 8. The image processing apparatus 91 can also perform various kinds of paste state testing (discussed below) based on the image processing program installed ahead of time.

The flow related to the bonding operation and testing of the paste state is as follows.

Figure 5:
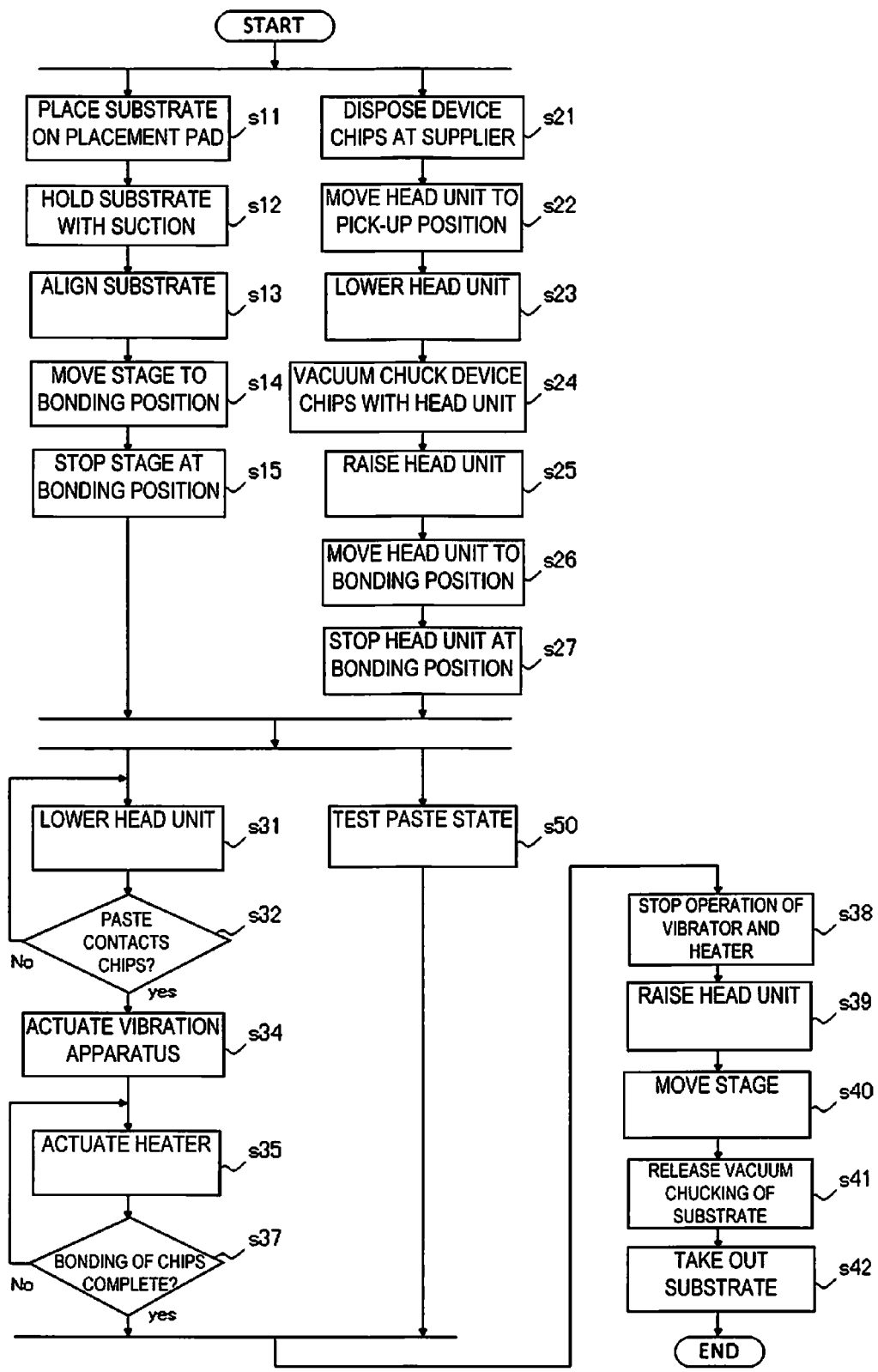
FIG. 5 is a flowchart of a specific embodiment of the present invention.

FIG. 5 is a flowchart of a specific embodiment of the present invention.

The substrate W on which the electrode pads P1 to P4 have been coated with bonding paste is placed on the stage 2 (s11). The bonding-use device chips C1 to C4 are arranged on the device chip supplier in a state of being aligned in specific positions and directions (s21).

Then, the stage 2 is held by suction (s12), the positional alignment of the substrate W is performed (s13), and the stage 2 is moved to the bonding position (s14) and halted there (s15).

Meanwhile, in order to pick up the bonding-use device chips C1 to C4, the head unit 3 is moved to a specific position above the chip supplier 7 (s22), the head unit 3 is lowered (s23), the device chips C1 to C4 are chucked by vacuum (s24), the head unit 3 is again raised (s25), and the head unit 3 is moved to the bonding position (s26) waits above the stage 2 (s27).

If the stage 2 and the head unit 3 are in a state that allows bonding, the head unit 3 is lowered (s31). Once the head unit 3 has been lowered, it is determined whether or not the device chips C1 to C4 are in contact with the bonding paste CP applied over the electrode pads P1 to P4 on the substrate W (s32). This determination can be made based on whether the current value of the rotational motor has risen or there is a change in the position of the Z axis slider or reduction in the amount of positional change, or based on the signal output of a pressure sensor built into the stage 2 or the head unit 3.

If it is determined that the device chips C1 to C4 are in contact with the bonding paste CP applied to the electrode pads P1 to P4 on the substrate W, the head vibrator 5 is actuated and the bonding paste CP is spread out in a thin, even layer (s34).

The heater is then actuated (s35), and the device chips C1 to C4 are bonded to the electrode pads P1 to P4.

At this point, the image observed by the bonding region observation component 8 is acquired as an image signal in parallel with the chip bonding operation, and the state of the bonding paste CP touching the device chips C1 to C4 is tested based on this image signal (s50).

If the device chips C1 to C4 have been bonded to the electrode pads P1 to P4 (s37), the vacuum chucking of the head unit 3 and the operation of the head vibrator and the heater are halted (s38), and the head unit 3 is raised (s39).

The stage 2 is then moved to the substrate replacement position (s40), the substrate is released from its vacuum chucked state (s41), and the substrate to which the device chips C1 to C4 have been bonded is taken out (s42).

The bonding apparatus 1 pertaining to the present invention further comprises a controller for controlling the various devices discussed above. Although a human is involved, this controller may operate semi-automatically, or the bonding operation and all the conditions may be set in advance and the series of bonding operations discussed above (S11 to S42) may be performed automatically based on a program.

Because the bonding apparatus 1 pertaining to the present invention is configured as above, the state of the bonding paste CP can be tested while the device chips C1 to C4 are simultaneously bonded over the electrode pads P1 to P4 provided to the surface of the substrate W.

Therefore, bonding failures between device chips and electrode pads can be prevented in the simultaneous bonding of a plurality of device chips, and the optimal bonding conditions and process margins can be found quickly.

Other Embodiment

The paste state tester pertaining to the present invention will now be described in detail. Let us assume that the paste state tester 9 has an image processing program installed in the image processing apparatus 91 to perform the following testing.

(1) Testing of Paste Bulge Distance

This involves testing the bulge distance, which indicates how far the bonding paste CP is bulging to the outside of the electrode pads P1 to P4. This test can be done if the substrate W is a transparent material.

Figure 6:
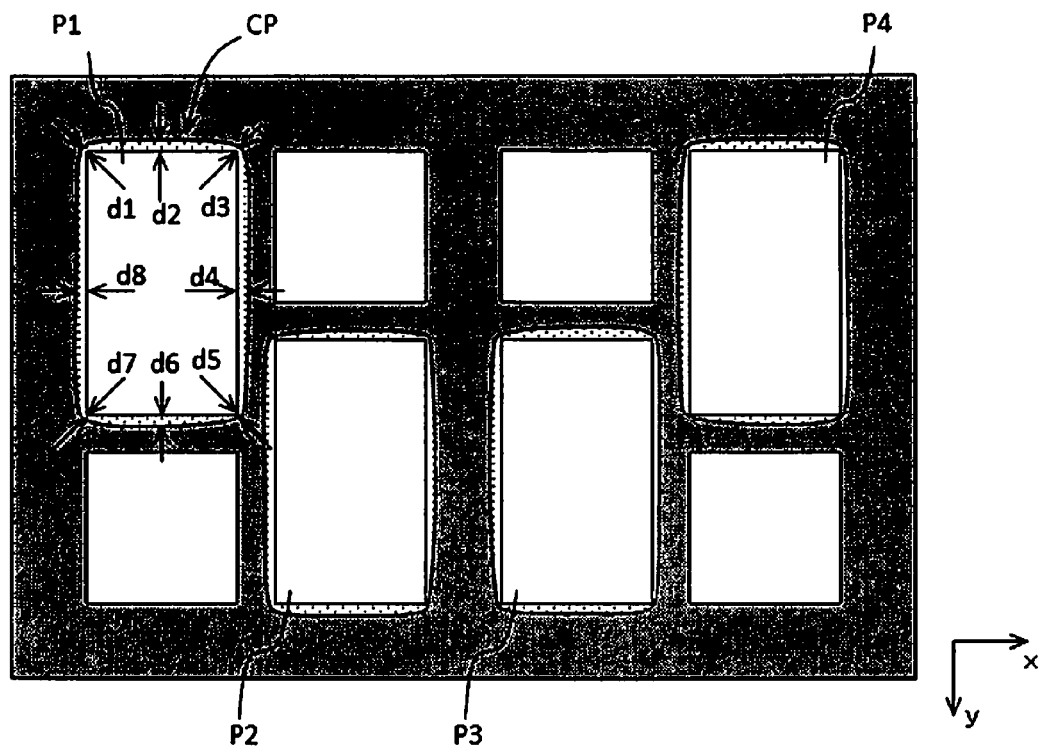
FIG. 6 is an image diagram of the main components in a specific embodiment of the present invention.

FIG. 6 is an image diagram of the main components in a specific embodiment of the present invention, and shows a simulation of the image as seen looking up from the substrate W from the lower face side by the bonding region observation component 8.

For example, as shown in FIG. 6, the paste state tester 9 measures the bulge distances d1 to d8 of the bonding paste CP that bulges out from the electrode pad P1. The bulge distances d1 to d8 here refer to the bulge distances from the area around the sides of the device chips C1 to C4. Here, to simplify the description, eight places at the corners and the ridges are set for measurement of the bulge distance, but the measurement sites may be further subdivided. The bulge distance of the bonding paste CP is similarly measured for the other electrode pads P2 to P4.

In this way, the bulge distance of the bonding paste CP that bulges out from the electrode pads P1 to P4 can be measured, and whether or not bonding failure has occurred in chip bonding can be tested.

(2) Testing of Curing Reaction State of Paste

This involves testing how far along the curing reaction has proceeded, from the color or contrast of the bonding paste CP that bonds the electrode pads P1 to P4 and the device chips C1 to C4. The substrate W is made of a transparent material, and the bonding paste CP bulging out from the electrode pads P1 to P4 is observed. If the bonding paste CP is made from silver nanoparticles and a binder, it will be blackish gray in color prior to thermosetting, but as the heating proceeds and the paste cures, it will change to a whitish gray or white color. Therefore, for the bonding paste CP that bulges out from the electrode pads P1 to P4, the color or contrast is bundled with the curing state, the image observed during thermosetting is acquired, image processing is performed, it is determined how far along the curing has proceeded, and the curing reaction state of the paste is tested. Alternatively, the substrate W is made of a transparent material and the electrode pads P1 to P4 are also configured as transparent electrodes, the entire bonding paste CP is observed through the substrate W, and the curing reaction state is tested.

Figure 7A:
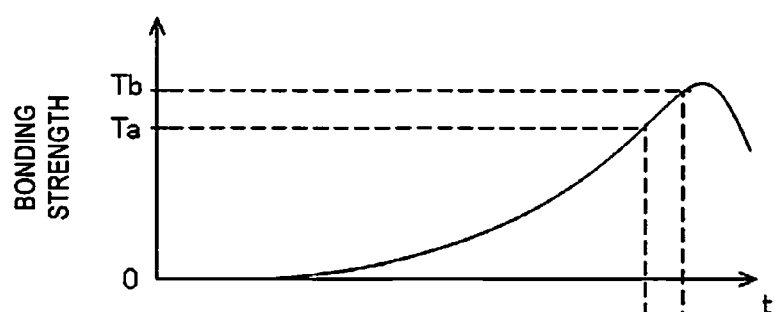
FIGS. 7A and 7B are graphs of the observation brightness and the bonding strength of the bonding paste used in the present invention.
Figure 7B:
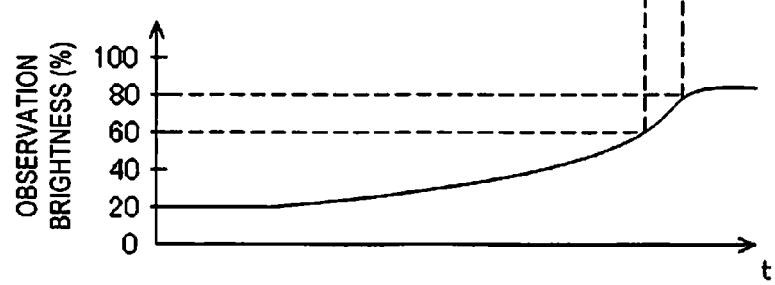

FIGS. 7A and 7B are graphs of the observation brightness and the bonding strength of the bonding paste used in the present invention. An example is shown of how the curing reaction state of the bonding paste CP changes, and how the observation brightness changes correspondingly. FIGS. 7A and 7B show the observation brightness and the bonding strength of the bonding paste CP on the vertical axis, and the heating time on the horizontal axis. The bonding paste CP in this example is such that the binder component volatilizes as the heating proceeds, and bonding strength gradually increases as the metal particles are bound together. When the bonding paste CP reaches the bonding strength Ta necessary for bonding the device chips, the observation brightness is 60%, and when it further reaches the bonding strength Tb, the observation brightness is 80%. When heating is continued further, there is a small increase in strength, but too much heating will end up diminishing the bonding strength.

Thus, bonding strength is testing by ascertaining the characteristics related to the curing reaction ahead of time for the bonding paste CP, and measuring the observation brightness. In other words, the paste state tester 9 can test the reaction state of the bonding paste CP.

(3) Other Testing of Paste State

The paste state tester 9 is not limited to the test categories discussed above, and may also test for whether or not bubbles have been generated and admixed during the pressurization, vibration, and heating of the bonding paste CP. In this case, the substrate W is made from a transparent material, and the electrode pads P1 to P4 are also transparent electrodes.

Other Embodiment

The bonding apparatus pertaining to the present invention may be configured to comprise a permissible bulge range setting component in the above-mentioned testing of the bulge distance of the paste, wherein the paste state tester 9 tests for whether or not the bulge distance of the bonding paste CP that bulges out from the outer peripheral part of the device chips C1 to C4 is within the permissible bulge range. The permissible bulge range setting component is used to set the permissible bulge range for the bulge distance of the bonding paste CP that bulges out from the outer peripheral part of the device chips C1 to C4.

More specifically, if the spacing between the electrode pads P1 to P4 is 1 mm, the permissible bulge range of the paste is set between 0.1 and 0.3 mm. For places with little bulging, it can be determined whether or not there is a minimum bulge of at least 0.1 mm, and for places with much bulging, it can be determined whether or not a clearance of at least 0.4 mm is ensured between adjacent electrodes.

Other Embodiment

The bonding apparatus pertaining to the present invention may also be configured so that, when the permissible bulge range is set for the above-mentioned testing of bulge distance of the paste, the paste state tester 9 sends a notification to the outside if the test results are abnormal. In this case, the paste state tester 9 measures the bulge distance of the bonding paste CP for each of the electrode pads P1 to P4, and if at least one of them is outside the permissible bulge range, a notification is given that the bulge distance is abnormal for that tested bonding paste.

More specifically, when the permissible bulge range for the paste is set to between 0.1 and 0.3 mm, if any of the the bulge distances measured for the electrode pads P1 to P4 exceeds 0.3 mm, or if any of the bulge distances is less than 0.1 mm, a notification that the bulge distance is abnormal is sent to the outside. This abnormality notification can be in the form of a change in the signal level connected to an external device, or a visual or audible notification to a worker with a lamp, a buzzer, or the like.

Sending this abnormality notification alerts a worker that bonding failure has occurred, and also alerts any downstream devices that bonding failure has occurred.

Other Embodiment

The bonding apparatus pertaining to the present invention may be configured to further comprise a permissible bulge upper limit setting component and a controller, for the above-mentioned testing of the paste bulge distance. The permissible bulge upper limit setting component is used to set the permissible bulge upper limit for the bulge distance of the bonding paste CP bulging out from the outer peripheral part of the electrode pads P1 to P4.

The controller 95 is used to halt the heating by the heater 32 and the heater 21b or to raise the head unit 3 if the paste state tester 9 determines that the bonding paste CP bulging out from the outer peripheral part of the electrode pads P1 to P4 has reached the permissible bulge upper limit. The controller 95 is connected to the heater 21b of the stage 2, the heater 32 of the head unit 3, the rotational motor 45 of the head lifting mechanism 4, which raises and lowers the head unit 3, and the paste state tester 9, and is used to control other connected devices based on the paste state test results.

More specifically, if the permissible bulge upper limit setting component has set the permissible bulge upper limit of the bonding paste CP to 0.3 mm, then the controller 95 performs the following control when the paste state tester 9 determines that the bonding paste CP bulging out from the outer peripheral part of the electrode pads P1 to P4 has exceeded 0.3 mm. This control involves 1) stopping the rotation of the rotational motor 45 of the head lifting mechanism 4, rotating the motor in the reverse direction, and raising the head unit 3, and 2) stopping the heating or lowering the heating temperature in the temperature regulation unit of the heater 32 of the head unit 3 and the heater 21b of the stage 2.

Thus halting the bonding based on the bulge distance test result from the paste state tester 9 prevents excessive heating and pressurization, and also prevents bonding failure before it happens.

Other Embodiment

The bonding apparatus pertaining to the present invention may be configured such that, in the above-mentioned testing of the curing reaction state of the paste, a curing reaction state permissible range setting component is provided, and the paste state tester 9 tests for whether or not the curing reaction state of the bonding paste CP is within the permissible range of the curing reaction state. The curing reaction state permissible range setting component sets the permissible range for the curing reaction state of the bonding paste CP.

More specifically, as shown in FIGS. 7A and 7B, an observation brightness of 60% to 80% corresponding to the bonding strength Ta and Tb of the bonding paste CP is set as the permissible range for the curing reaction state.

This allows the test to determine whether or not the bonding paste CP has the specified bonding strength (that is, within the range of Ta to Tb).

Other Embodiment

The bonding apparatus pertaining to the present invention may be configured such that when the permissible range of the curing reaction state has been set for the above-mentioned testing of the curing reaction state of the paste, the paste state tester 9 sends a notification to the outside if the test result is abnormal. In this case, the paste state tester 9 measures the curing reaction state of the bonding paste CP for each of the electrode pads P1 to P4, and if at least one of them is outside the permissible range for the curing reaction state, a notification is given that the curing reaction state for the tested bonding paste is abnormal.

More specifically, if the permissible range for the bonding strength of the bonding paste has been set between Ta and Tb (that is, an observation brightness of 60 to 80%), a notification is given to the outside that the curing reaction state for the bonding paste CP is abnormal if the observation brightness exceeds 80% for the bonding paste CP of any of the electrode pads P1 to P4, or if the observation brightness for any of them is less than 60%. This abnormality notification can be in the form of a change in the signal level connected to an external device, or a visual or audible notification to a worker with a lamp, a buzzer, or the like.

Sending this abnormality notification alerts a worker that bonding failure has occurred, and also alerts any downstream devices that bonding failure has occurred.

Other Embodiment

The bonding apparatus pertaining to the present invention may be configured to further comprise a curing reaction state permissible range setting component and a controller, for the above-mentioned testing of the curing reaction state of the bonding paste CP. The curing reaction state permissible range setting component is used to set the permissible upper limit for the curing reaction state of the bonding paste CP.

The controller 95 is used to halt the heating by the heater 21b or 32 or to raise the head unit 3 if the paste state tester 9 determines that the bonding paste CP has reached the permissible upper limit for the curing reaction state. The controller 95 is connected to the heater 21b of the stage 2, the heater 32 of the head unit 3, the rotational motor 45 of the head lifting mechanism 4, which raises and lowers the head unit 3, and the paste state tester 9, and is used to control other connected devices based on the paste state test results.

More specifically, if the curing reaction state permissible range setting component has set an observation brightness of 80% as the permissible upper limit for the curing reaction state of the bonding paste CP, then the controller 95 performs the following control when the observation brightness of the bonding paste CP exceeds 80%. This control involves 1) stopping the rotation of the rotational motor 45 of the head lifting mechanism 4, rotating the motor in the reverse direction, and raising the head unit 3, and 2) stopping the heating or lowering the heating temperature in the temperature regulation unit of the heater 32 of the head unit 3 and the heater 21b of the stage 2.

Thus halting the bonding based on the paste reaction state test result from the paste state tester 9 prevents excessive heating and pressurization, and also prevents bonding failure before it happens.

Other Embodiment

Figure 8:
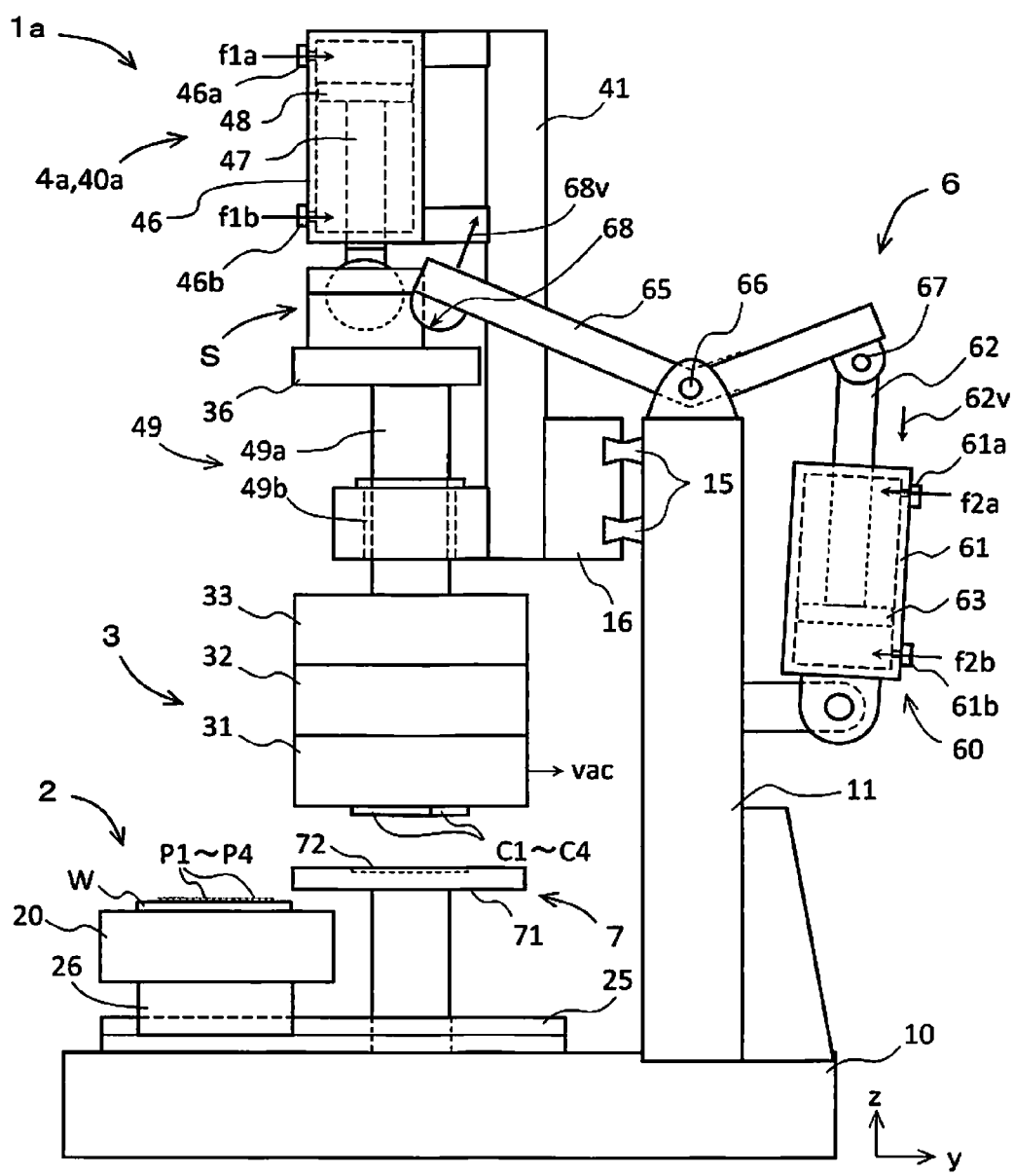
FIG. 8 is an overall side view of an example of another specific embodiment of the present invention.
Figure 9:
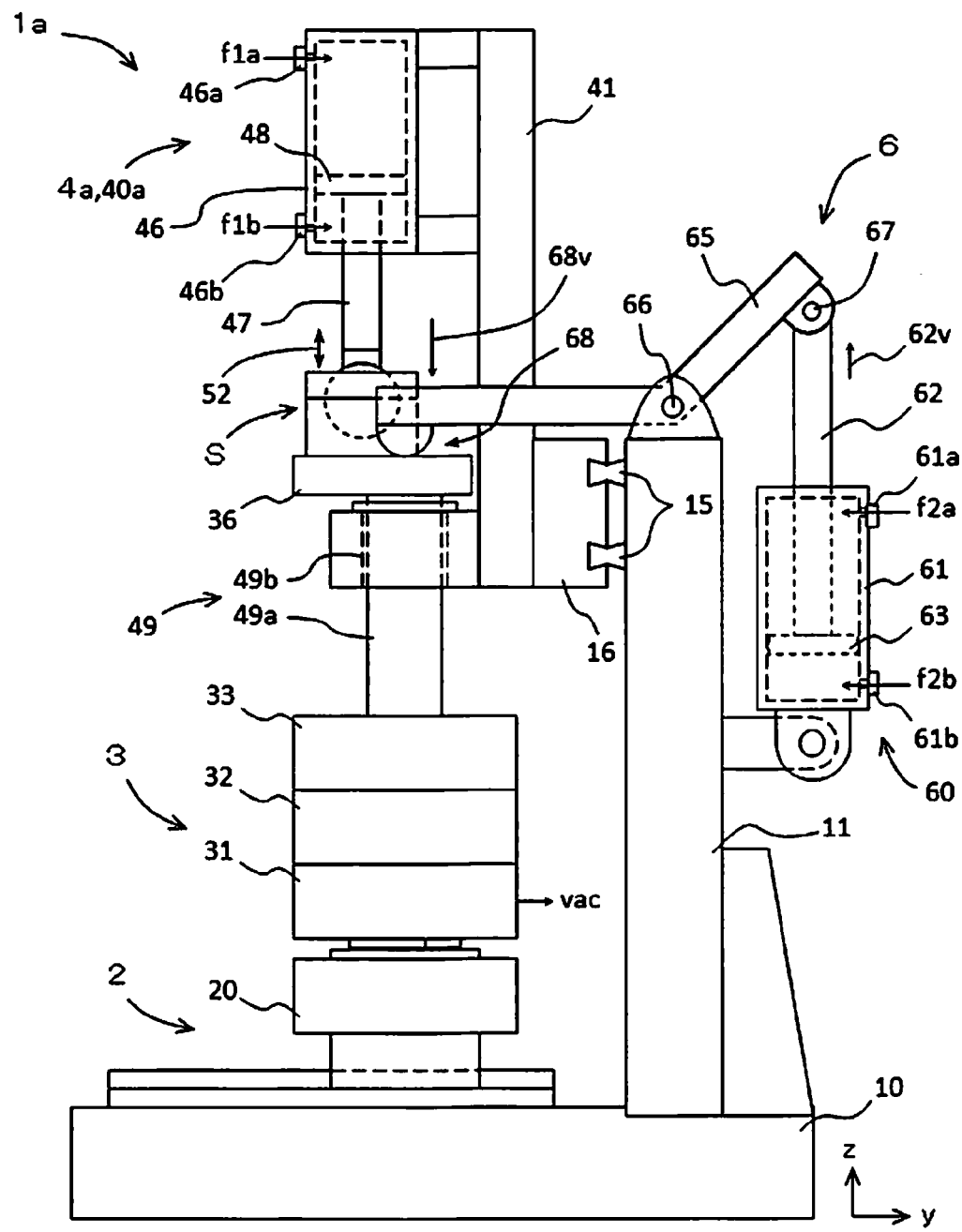
FIG. 9 is an overall side view of an example of another specific embodiment of the present invention.

In applying the present invention, the head lifting mechanism 4 and the head vibrator 5 are not limited to the configuration discussed above through reference to FIGS. 1 and 3, and the head lifting mechanism 4a and head vibrator 5a shown in FIGS. 8 and 9 may be used instead.

FIGS. 8 and 9 are simplified overall views of an example of another specific embodiment of the present invention.

FIG. 8 shows the state when the head unit 3 has been raised, and FIG. 9 shows the state when the head unit 3 has been lowered.

The bonding apparatus 1a pertaining to the present invention comprises the stage 2 and head unit 3 that are common to the bonding apparatus 1, but also comprises a head lifting mechanism 4a that has a different configuration.

The head lifting mechanism 4a is used to raise and lower the head unit 3 in the up and down direction relative to the stage 2. A linking member 36 of the head unit 3 is attached via a spherical bearing SD to a shaft 47, which is a movable-side member of the head lifting mechanism 4a.

More specifically, the head lifting mechanism 4a is constituted by a direct-acting cylinder unit 40a attached to the base plate 41. The direct-acting cylinder unit 40a comprises a housing 46, the shaft 47, and pressurized fluid supply ports 46a and 46b for moving the shaft 47 in and out. The housing 46 has a sealed cavity in its interior, and is configured such that the pressure differential in the fluid supplied to the pressurized fluid supply ports 46a and 46b causes a valve plate 48 connected to the shaft 47 to move back and forth within the housing 46.

More specifically, in a state in which the pressure f1a on the pressurized fluid supply port 46a side of the direct-acting cylinder unit 40a is lower than the pressure f1b on the pressurized fluid supply port 46b side (such as when the pressurized fluid supply port 46a side is released to the atmosphere, and compressed air is supplied to the pressurized fluid supply port 46b side), the shaft 47 and the head unit 3 rise as shown in FIG. 8.

Conversely, in a state in which the pressure f1a on the pressurized fluid supply port 46a side of the direct-acting cylinder unit 40a is higher than the pressure f1b on the pressurized fluid supply port 46b side (such as when compressed air is supplied to the pressurized fluid supply port 46a side, and the pressurized fluid supply port 46b side is released to the atmosphere), the shaft 47 and the head unit 3 descend to the stage 2 side as shown in FIG. 9.

Also, a lifting guide 49 is provided to the base plate 41, so that the up and down motion of the head unit 3 will be smooth, and there will be no horizontal wobble. The lifting guide lifting guide 49 includes a shaft 49s and a linear bushing 49b.

The head vibrator 5a is used to vibrate the head unit 3 in the up and down direction by means of the repeated raising and lower of the head lifting mechanism 4a in a state in which the head unit 3 has been lowered to the stage 2 side. More specifically, the head vibrator 5a can be such that the reciprocal operation of the direct-acting cylinder unit 40a of the head lifting mechanism 4a is switched at high speed.

Other Embodiment

The bonding apparatus 1a pertaining to the present invention may further comprise a head pressurization component 6.

The head pressurization component 6 is used to further pressurize the head unit 3 toward the stage 2 side.

More specifically, the head pressurization component 6 can be configured as shown in FIGS. 8 and 9. That is, the head pressurization component 6 comprises a mechanism that further holds down a shaft 49a, which is a movable-side member for moving the head unit 3 in the up and down direction, on the stage 2 side via a linking member 33 attached to the head unit 3.

Even more specifically, the head pressurization component 6 comprises a direct-acting cylinder unit 60 and a hold-down member 65. The direct-acting cylinder unit 60 comprises a housing 61, a shaft 62, and pressurized fluid supply ports 61a and 61b for moving the shaft 62 in and out. The housing 61 has a sealed cavity in its interior, and is configured such that the pressure differential in the fluid supplied to the pressurized fluid supply ports 61a and 61b causes a valve plate 63 connected to the shaft 62 to move back and forth within the housing 61.

One end of the shaft 62 is attached to the hold-down member 65 via a knuckle joint 67. The hold-down member 65 is either straight or substantially L-shaped (including substantially V-shaped), and is attached to the linking member 11 of the apparatus frame 10 via the a knuckle joint 66.

Because of this configuration, the distal end part 68 of the hold-down member 65 rotates in the up and down direction around the axis of the knuckle joint 66 along with the reciprocal motion of the shaft 62.

More specifically, in a state in which the pressure f2a on the pressurized fluid supply port 61a side of the direct-acting cylinder unit 60 is greater than the pressure f2b on the pressurized fluid supply port 61b side (such as when compressed air is supplied to the pressurized fluid supply port 61a side, and the pressurized fluid supply port 61b side is released to the atmosphere), the shaft 62 is lowered in the direction indicated by the arrow 62v as shown in FIG. 8, and the distal end part 68 of the hold-down member 65 is raised in the direction indicated by the arrow 68v. In this state, the distal end part 68 is separated from the linking member 36 linked to the head unit 3, and no pressing force is exerted to press the head unit 3 to the stage 2 side.

Conversely, in a state in which the pressure f2a on the pressurized fluid supply port 61a side of the direct-acting cylinder unit 60 is lower than the pressure f2b on the pressurized fluid supply port 61b side (such as when the pressurized fluid supply port 61a side is released to the atmosphere, and compressed air is supplied to the pressurized fluid supply port 61b side), the shaft 62 is raised in the direction indicated by the arrow 62v as shown in FIG. 9, and the distal end part 68 of the hold-down member 65 is lowered in the direction indicated by the arrow 68v. In this state, the distal end part 68 presses against the linking member 36 linked to the head unit 3, and a pressing force is exerted to press the head unit 3 to the stage 2 side.

Because of this configuration, with the bonding apparatus comprising the head pressurization component 6, the bonding paste CP is spread out by the vibration of the head vibrator and the lowering action of the head lifter, after which the spacing can be maintained between the device chips C1 to C4 and the electrode pads P1 to P4. Furthermore, the device chips C1 to C4 can be pushed further in to the substrate W side, and can be moved slightly closer to the electrode pads P1 to P4.

The point at which the distal end part 68 of the hold-down member 65 touches the linking member 36 serves as the action point of exertion of pushing-in force by the head pressurization component 6 here, and a force that presses the head unit 3 toward the stage 2 is exerted on this action point on the linking member 36. Therefore, even if the force at which the head pressurization component 6 pushes in the head unit 3 is set high, pressurization can be performed regardless of the up and down motion of the head lifting mechanism 4. As a result, this prevents too much stress from being exerted on the direct-acting guide portion of the head lifting mechanism 4 or the X axis slider 16, such as what occurs when pressurization force is applied by only the head lifting mechanism 4.

Therefore, in a state in which the stage 2 and the head unit 3 are kept in parallel, when the device chips C1 to C4 are heated in order to bond the device chips and the electrode pads, and the solvent of the bonding paste CP is volatilized, resulting in a reduction in volume, the bonding can be ended in a state in which the bonding paste CP has moved all the way across the entire contact surface area.

The bonding apparatus 1a of the present invention comprising this head pressurization component 6 may also be configured such that bonding paste CP bulge testing or reaction state testing is combined, and the pressurization by the head pressurization component 6 is stopped according to the test results.

More specifically, the apparatus may comprise a bonding paste CP permissible bulge upper limit setting component or a bonding paste CP curing reaction state permissible range setting component and the controller 95. The bonding paste CP permissible bulge upper limit setting component or curing reaction state permissible range setting component can be configured the same as above, for example. Furthermore, the controller 95 may be configured so that the pressurization by the head pressurization component 6 is stopped if the paste state tester 9 determines that the bonding paste CP bulging out from the outer peripheral part of the electrode pads P1 to P4 has reached the permissible bulge upper limit, or that the reaction state of the bonding paste CP has reached the permissible upper limit.

Even more specifically, the controller 95 controls the pressure of the fluids supplied to the pressurized fluid supply ports 61a and 61b of the direct-acting cylinder unit 60 based on the test result outputted from the paste state tester 9, and the shaft 62 is retracted to produce the state shown in FIG. 8 (that is, a state in which no force is acting to press the head unit 3 downward).

Accordingly, paste bulging and bonding failure caused by the excessive pressurization of the head unit 3 can be prevented in a configuration comprising a head pressurization component.

Other Embodiment

In the above description, an example configuration was given in which the heaters 21b and 32 that heated the bonding paste CP were provided to both the stage 2 and the head unit 3. This shortens the time it takes to heat for bonding, and therefore improves production efficiency. However, embodiments of the present invention are not limited to this, and just one or the other of these heaters may be provided.

The invention claimed is:

1. A bonding apparatus for bonding a plurality of device chips on a plurality of electrode pads provided to a surface of a substrate, the bonding apparatus comprising:
a stage on which the substrate is placed and supported;
a head unit configured to hold the device chips to be bonded on the electrode pads;
a head lifting mechanism configured to raise and lower the head unit in an up and down direction relative to the stage;
a head vibrator configured to vibrate the head unit in the up and down direction;
a heater configured to heat a bonding paste that bonds the device chips and the electrode pads; and
a bonding region observation component configured to observe a region that includes at least a peripheral part of the electrode pads to which the device chips have been bonded,
the stage having a support member that is configured to support the substrate, the support member has a portion corresponding to the peripheral part of the electrode pads to which the device chips have been bonded and an outside part thereof, the portion of the support member being made from a transparent material,
the bonding region observation component being disposed opposite the head unit to sandwich the support member of the stage therebetween, and
the bonding region observation component including
an image signal acquisition component that is configured to acquire an image signal of an image observed with the bonding region observation component; and
a paste state tester that is configured to test a state of the bonding paste that touches the device chips based on the image signal.

2. The bonding apparatus according to claim 1, wherein the paste state tester is configured to test bulge distance of the bonding paste bulging out from a periphery of the device chips.

3. The bonding apparatus according to claim 2, further comprising
a permissible bulge range setting component configured to set a permissible bulge range for the bulge distance of the bonding paste bulging out from an outer peripheral part of the electrode pads,
the paste state tester being configured to test whether or not the bulge distance of the bonding paste bulging out from the outer peripheral part of the electrode pads is within the permissible bulge range.

4. The bonding apparatus according to claim 3, wherein the paste state tester is configured to notify a user that the bulge distance of the tested bonding paste is abnormal if the bulge distance of the tested bonding paste is outside the permissible bulge range for at least one of the electrode pads.

5. The bonding apparatus according to claim 2, further comprising:
a permissible bulge tipper limit setting component configured to set a permissible bulge upper limit for the bulge distance of the bonding paste bulging out from an outer peripheral part of the electrode pads; and
a controller configured to halt heating by the heater or raise the head unit if the paste state tester determines that the bonding paste bulging out from the outer peripheral part of the electrode pads has reached the permissible bulge upper limit.

6. The bonding apparatus according to claim 2, further comprising:
a head pressurization component configured to pressurize the head unit toward the stage side;
a permissible bulge upper limit setting component configured to set a permissible bulge upper limit for the bulge distance of the bonding paste bulging out from an outer peripheral part of the electrode pads; and
a controller configured to halt pressurization by the head pressurization component if the paste state tester determines that the bonding paste bulging out from the outer peripheral part of the electrode pads has reached the permissible bulge upper limit.

7. The bonding apparatus according to claim 1, wherein the paste state tester is configured to test curing reaction state of the bonding paste.

8. The bonding apparatus according to claim 7, further comprising a curing reaction state permissible range setting component configured to set a permissible range of the curing reaction state of the bonding paste, the paste state tester being configured to test whether or not the bonding paste is within the permissible range of the curing reaction state.

9. The bonding apparatus according to claim 8, wherein the paste state tester is configured to notify a user that the curing reaction state of the tested bonding paste is abnormal if the tested bonding paste is outside the permissible range of the curing reaction state for at least one of the electrode pads.

10. The bonding apparatus according to claim 7, further comprising:
a permissible curing reaction state upper limit setting component configured to set a permissible upper limit for the curing reaction state of the bonding paste; and
a controller configured to halt heating by the heater or raise the head unit if the paste state tester determines that the bonding paste has reached the permissible upper limit for the curing reaction state.

11. The bonding apparatus according to claim 7, further comprising:
a head pressurization component configured to pressurize the head unit toward the stage side;
a permissible curing reaction state upper limit setting component configured to set a permissible upper limit for the curing reaction state of the bonding paste; and
a controller configured to halt pressurization by the head pressurization component if the paste state tester determines that the bonding paste has reached the permissible upper limit for the curing reaction state.

12. The bonding apparatus according to claim 3, further comprising:
a permissible bulge upper limit setting component configured to set a permissible bulge upper limit for the bulge distance of the bonding paste bulging out from an outer peripheral part of the electrode pads; and
a controller configured to halt heating by the heater or raise the head unit if the paste state tester determines that the bonding paste bulging out from the outer peripheral part of the electrode pads has reached the permissible bulge upper limit.

13. The bonding apparatus according to claim 4, further comprising:
a permissible bulge upper limit setting component configured to set a permissible bulge upper limit for the bulge distance of the bonding paste bulging out from an outer peripheral part of the electrode pads; and
a controller configured to halt heating by the heater or raise the head unit if the paste state tester determines that the bonding paste bulging out from the outer peripheral part of the electrode pads has reached the permissible bulge upper limit.

14. The bonding apparatus according to claim 3, further comprising:
a head pressurization component configured to pressurize the head unit toward the stage side;
a permissible bulge upper limit setting component configured to set a permissible bulge upper limit for the bulge distance of the bonding paste bulging out from an outer peripheral part of the electrode pads; and
a controller configured to halt pressurization by the head pressurization component if the paste state tester determines that the bonding paste bulging out from the outer peripheral part of the electrode pads has reached the permissible bulge upper limit.

15. The bonding apparatus according to claim 4, further comprising:
a head pressurization component configured to pressurize the head unit toward the stage side;
a permissible bulge upper limit setting component configured to set a permissible bulge upper limit for the bulge distance of the bonding paste bulging out from an outer peripheral part of the electrode pads; and
a controller configured to halt pressurization by the head pressurization component if the paste state tester determines that the bonding paste bulging out from the outer peripheral part of the electrode pads has reached the permissible bulge upper limit.

16. The bonding apparatus according to claim 8, further comprising:
a permissible curing reaction state upper limit setting component configured to set a permissible upper limit for the curing reaction state of the bonding paste; and
a controller configured to halt heating by the heater or raise the head unit if the paste state tester determines that the bonding paste has reached the permissible upper limit for the curing reaction state.

17. The bonding apparatus according to claim 9, further comprising:
a permissible curing reaction state upper limit setting component configured to set a permissible upper limit for the curing reaction state of the bonding paste; and
a controller configured to halt heating by the heater or raise the head unit if the paste state tester determines that the bonding paste has reached the permissible upper limit for the curing reaction state.

18. The bonding apparatus according to claim 8, further comprising:
a head pressurization component configured to pressurize the head unit toward the stage side;
a permissible curing reaction state upper limit setting component configured to set a permissible upper limit for the curing reaction state of the bonding paste; and
a controller configured to halt pressurization by the head pressurization component if the paste state tester determines that the bonding paste has reached the permissible upper limit for the curing reaction state.

19. The bonding apparatus according to claim 9, further comprising:
a head pressurization component configured to pressurize the head unit toward the stage side;
a permissible curing reaction state upper limit setting component configured to set a permissible upper limit for the curing reaction state of the bonding paste; and
a controller configured to halt pressurization by the head pressurization component if the paste state tester determines that the bonding paste has reached the permissible upper limit for the curing reaction state.

* * * * *